(12) United States Patent
Sung et al.

(10) Patent No.: US 9,123,282 B2
(45) Date of Patent: Sep. 1, 2015

(54) DISPLAY

(75) Inventors: Li-Wei Sung, Tainan (TW); Yen-Wei Chen, Tainan (TW); Chung-Lin Tsai, Tainan (TW)

(73) Assignee: INNOLUX CORPORATION, Chu-Nan (TW)

( * ) Notice: Subject to any disclaimer, the term of this patent is extended or adjusted under 35 U.S.C. 154(b) by 558 days.

(21) Appl. No.: 13/102,334

(22) Filed: May 6, 2011

(65) Prior Publication Data

US 2011/0279420 A1    Nov. 17, 2011

(30) Foreign Application Priority Data

May 11, 2010   (TW) ................................ 99114964 A

(51) Int. Cl.
| | | |
|---|---|---|
| *G11C 19/00* | (2006.01) | |
| *G09G 3/20* | (2006.01) | |
| *G09G 3/32* | (2006.01) | |
| *G11C 19/28* | (2006.01) | |

(52) U.S. Cl.
CPC ................ *G09G 3/20* (2013.01); *G09G 3/3266* (2013.01); *G11C 19/287* (2013.01); *G09G 2310/0224* (2013.01); *G09G 2310/0286* (2013.01); *G09G 2320/0219* (2013.01)

(58) Field of Classification Search
CPC .............. G09G 3/3688; G09G 3/3677; G09G 2310/0286; G09G 3/3648; G09G 3/3266

USPC ........ 377/64, 67, 69, 77, 78, 79; 345/87, 100, 345/93, 98; 326/46; 327/142; 365/189.07
See application file for complete search history.

(56) References Cited

U.S. PATENT DOCUMENTS

| | | | | |
|---|---|---|---|---|
| 8,629,828 | B2 * | 1/2014 | Jinta | 345/100 |
| 8,730,145 | B2 * | 5/2014 | Jinta | 345/100 |
| 2001/0005196 | A1 * | 6/2001 | Ishii | 345/100 |
| 2001/0050678 | A1 * | 12/2001 | Nishikubo et al. | 345/204 |
| 2002/0167026 | A1 * | 11/2002 | Azami et al. | 257/200 |
| 2003/0058234 | A1 * | 3/2003 | Kanzaki et al. | 345/211 |
| 2003/0128180 | A1 * | 7/2003 | Kim et al. | 345/100 |
| 2003/0189542 | A1 * | 10/2003 | Lee et al. | 345/93 |
| 2003/0227433 | A1 * | 12/2003 | Moon | 345/100 |

(Continued)

*Primary Examiner* — Michael J Eurice
(74) *Attorney, Agent, or Firm* — Liu & Liu

(57) ABSTRACT

A display is disclosed. The display comprises a panel, a data driver and a scan driver. The panel comprises pixels, data lines and scan lines. The data lines transmit data signals to the pixels, and the scan lines transmit scan signals to the pixels. The data driver provides the data signals, and the scan driver provides the scan signals. The scan driver comprises a shift register circuit. The shift register circuit comprises an $i+1^{th}$ stage carry shift register, an $i^{th}$ stage carry shift register and a $j^{th}$ stage buffer shift register. The $i^{th}$ stage carry shift register generates an $i+1^{th}$ start signal to start the $i+1^{th}$ stage carry shift register, so that the $i+1^{th}$ stage carry shift register generates an $i+2^{th}$ start signal. The $i+1^{th}$ start signal starts the $j^{th}$ stage buffer shift register to generate a $j^{th}$ output signal.

10 Claims, 11 Drawing Sheets

(56) References Cited

U.S. PATENT DOCUMENTS

| | | | |
|---|---|---|---|
| 2003/0231735 A1* | 12/2003 | Moon et al. | 377/64 |
| 2003/0234761 A1* | 12/2003 | Washio et al. | 345/100 |
| 2004/0150610 A1* | 8/2004 | Zebedee et al. | 345/100 |
| 2004/0189584 A1* | 9/2004 | Moon | 345/100 |
| 2005/0083292 A1* | 4/2005 | Moon et al. | 345/100 |
| 2006/0210012 A1* | 9/2006 | Yamaguchi et al. | 377/64 |
| 2006/0220587 A1* | 10/2006 | Tobita et al. | 315/194 |
| 2006/0291298 A1* | 12/2006 | Kang et al. | 365/189.07 |
| 2008/0101529 A1* | 5/2008 | Tobita | 377/64 |
| 2008/0116944 A1* | 5/2008 | Tobita et al. | 327/142 |
| 2008/0246716 A1* | 10/2008 | Miyake et al. | 345/92 |
| 2008/0246717 A1* | 10/2008 | Miyake et al. | 345/92 |
| 2009/0027318 A1* | 1/2009 | Murakami et al. | 345/87 |
| 2009/0251443 A1* | 10/2009 | Jinta | 345/204 |
| 2010/0238156 A1* | 9/2010 | Iwamoto et al. | 345/213 |

* cited by examiner

US 9,123,282 B2

1
DISPLAY

This application claims the benefit of Taiwan application Serial No. 99114964, filed May 11, 2010, the subject matter of which is incorporated herein by reference.

BACKGROUND

1. Technical Field

The disclosure relates in general to a display, and more particularly to a display capable of independently generating start signals and output signals respectively.

2. Description of the Related Art

Referring to FIG. 1 and FIG. 2. FIG. 1 shows a conventional shift register circuit. FIG. 2 shows a signal timing diagram of FIG. 1. The conventional shift register circuit 122 comprises a plurality of stages of shift registers. For convenience of elaboration, the shift registers are exemplified by a first stage shift register SR1 to a fourth stage shift register SR4. The first stage shift register SR1 to the fourth stage shift register SR4 generate a first stage output signal O1 to a fourth stage output signal O4. The first stage output signal O1 generated by the first stage shift register SR1 is inputted to start the second stage shift register SR2 to generate a second stage output signal O2. The second stage output signal O2 generated by the second stage shift register SR2 is inputted to start the third stage shift register SR3 to generate a third stage output signal O3. The third stage output signal O3 generated by the third stage shift register SR3 is inputted to start the fourth stage shift register SR4 to generate a fourth stage output signal O4. The operation of the output signals of other stages can be obtained in the same manner.

Referring to FIG. 3, a circuit diagram of a first conventional shift register is shown. The first stage shift register SR1 comprises transistors T1~T4. The transistor T1 outputs a first stage output signal O1 according to a clock signal CK1. The transistor T2 is coupled to the transistor T1 and controlled by the second stage output signal O2 outputted from the second stage shift register SR. The transistor T3 is controlled by the second stage output signal O2 outputted from the second stage buffer shift register SR2. The transistor T4 is coupled to the transistor T3 for driving the transistor T1 according to the first stage start signal STV. The transistor T2 is coupled to the transistor T1 and a coupling capacitor Cb. The circuit design of the second stage shift register SR2 is similar to that of the first stage carry shift register SR1, and the similarities are not repeated here.

Referring to FIG. 4, a circuit diagram of a second conventional shift register is shown. FIG. 4 is different from of FIG. 3 in that the shift registers SR1' and SR2' of FIG. 4 further comprise a transistor T5. The transistor T5 is controlled by the potential of a node B to selectively output a start signal C2 to start the shift register SR2 according to the clock signal CK1.

In the display region (also referred as active matrix array region) of the display panel, the scan lines and the data lines are interlaced, when the voltage on the data lines varies, the voltage on the scan lines varies as well. Thus, the output signal of the conventional shift register circuit will be interfered with by the noises. When the output signal interfered with by the noises is inputted to the next stage shift register, the noises will be amplified and cause abnormal operation to the shift register circuit.

SUMMARY

The disclosure is directed to a display, which adopts a carry shift register to independently output a start signal and adopts a buffer shift register to independently output an output signal. Since the buffer shift register and the carry shift register are divided into two independent loops, the output signal generated by the buffer shift register will not be used as a start signal in the next stage. When the buffer shift register is interfered with by noises, the noises will not be inputted to the next stage. Thus, the abnormal operation of the shift register circuit due to the amplification of the noises will not occur.

According to a first aspect of the present disclosure, a display is provided. The display comprises a panel, a data driver and a scan driver. The panel comprises pixels, data lines and scan lines. The data lines transmit data signals to the pixels, and the scan lines transmit scan signals to the pixels. The data driver provides the data signals, and the scan driver provides the scan signals. The scan driver comprises a shift register circuit. The shift register circuit comprises a plurality of stages of carry shift registers and a plurality of stages of buffer shift registers. The carry shift registers generates a plurality of start signals comprising an $i+1^{th}$ start signal and an $i+2^{th}$ start signal. The carry shift registers comprise an $i+1^{th}$ stage carry shift register and an $i^{th}$ stage carry shift register. The $i^{th}$ stage carry shift register generates an $i+1^{th}$ start signal to start the $i+1^{th}$ stage carry shift register, so that the $i+1^{th}$ stage carry shift register generates an $i+2^{th}$ start signal. The buffer shift registers generates a plurality of output signals comprising a $j^{th}$ output signal and respectively corresponding to a plurality of scan signals. These stages of buffer shift registers comprise a $j^{th}$ stage buffer shift register. The $i+1^{th}$ start signal starts the $j^{th}$ stage buffer shift register to generate a $j^{th}$ output signal The above and other aspects of the disclosure will become better understood with regard to the following detailed description of the non-limiting embodiment(s). The following description is made with reference to the accompanying drawings.

DETAILED DESCRIPTION

Figure 1:
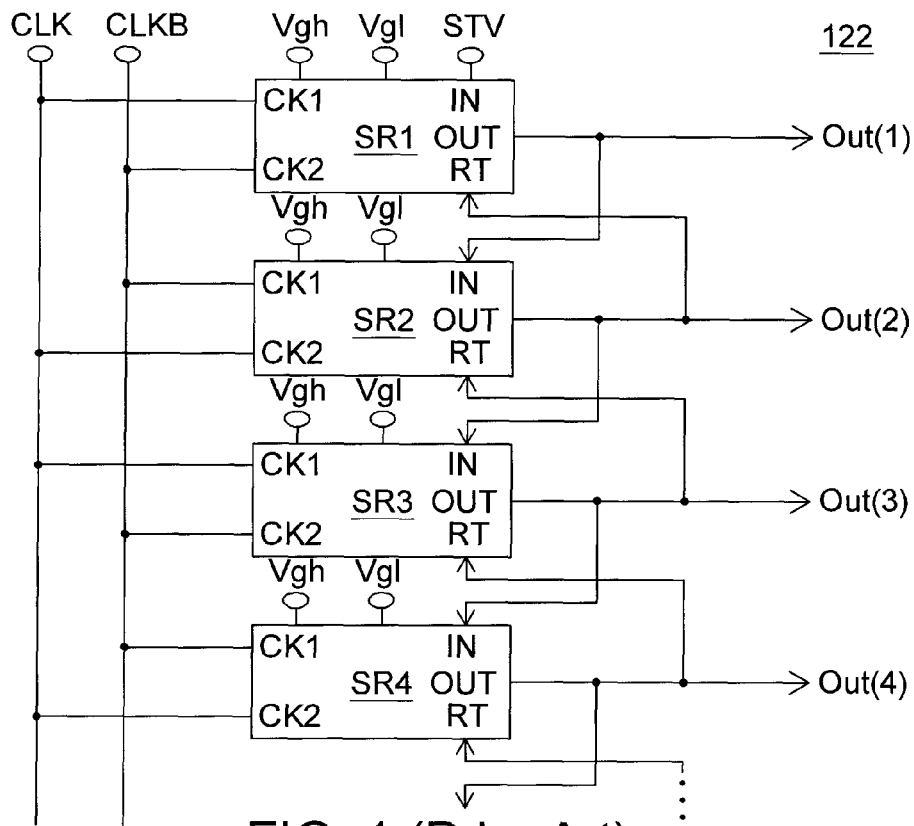
FIG. 1 shows a conventional shift register circuit.
Figure 2:
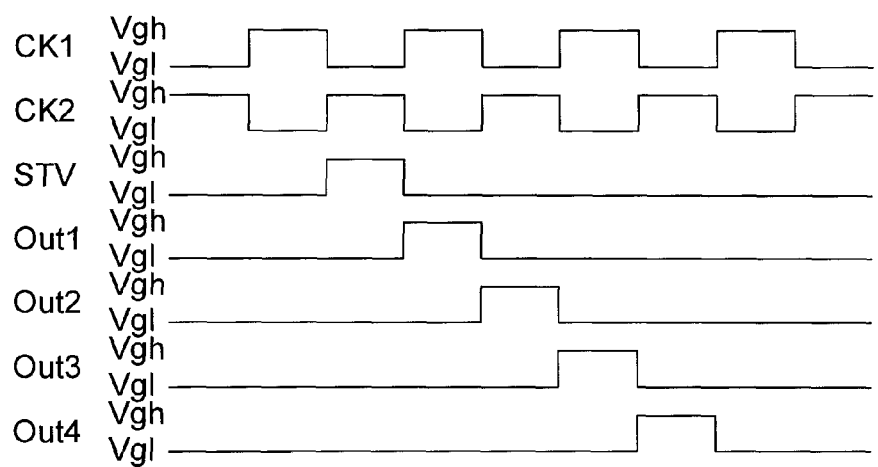
FIG. 2 shows a signal timing diagram of FIG. 1.
Figure 3:
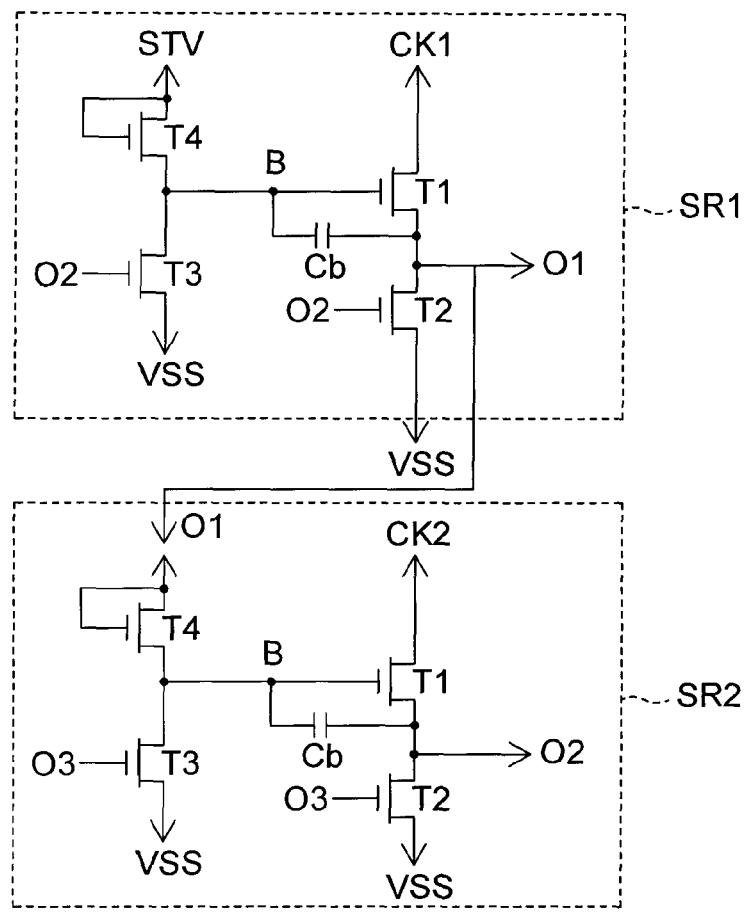
FIG. 3 shows a circuit diagram of a first conventional shift register
Figure 4:
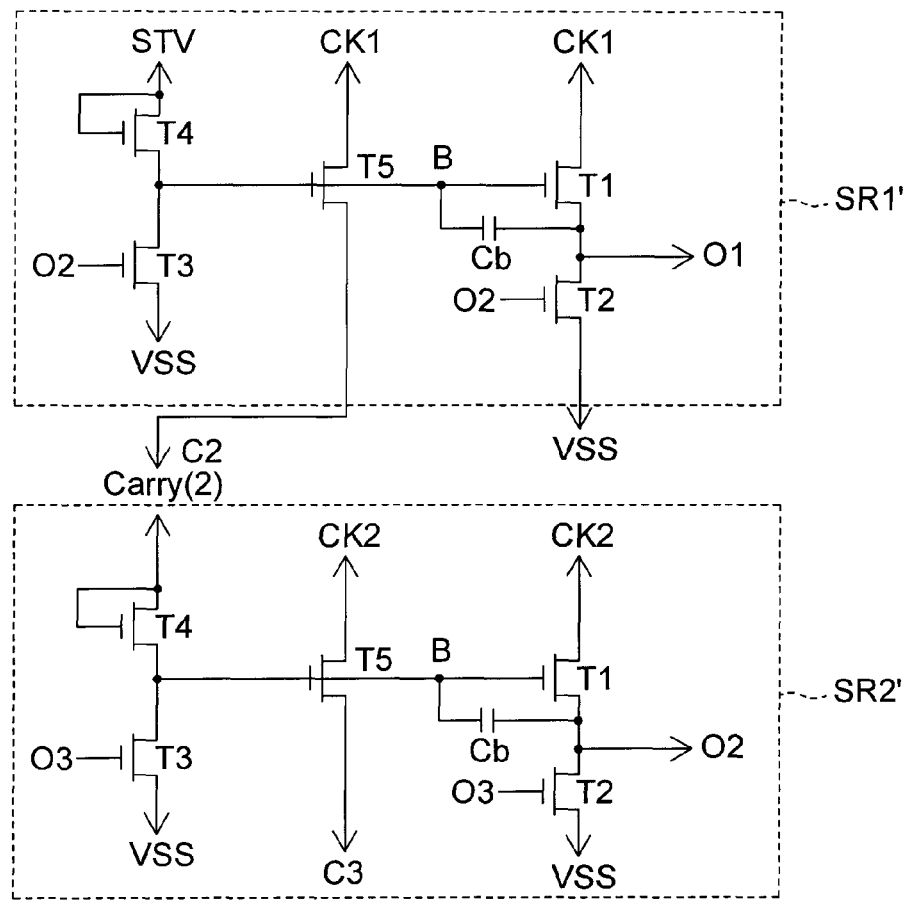
FIG. 4 shows a circuit diagram of a second conventional shift register.
Figure 5:
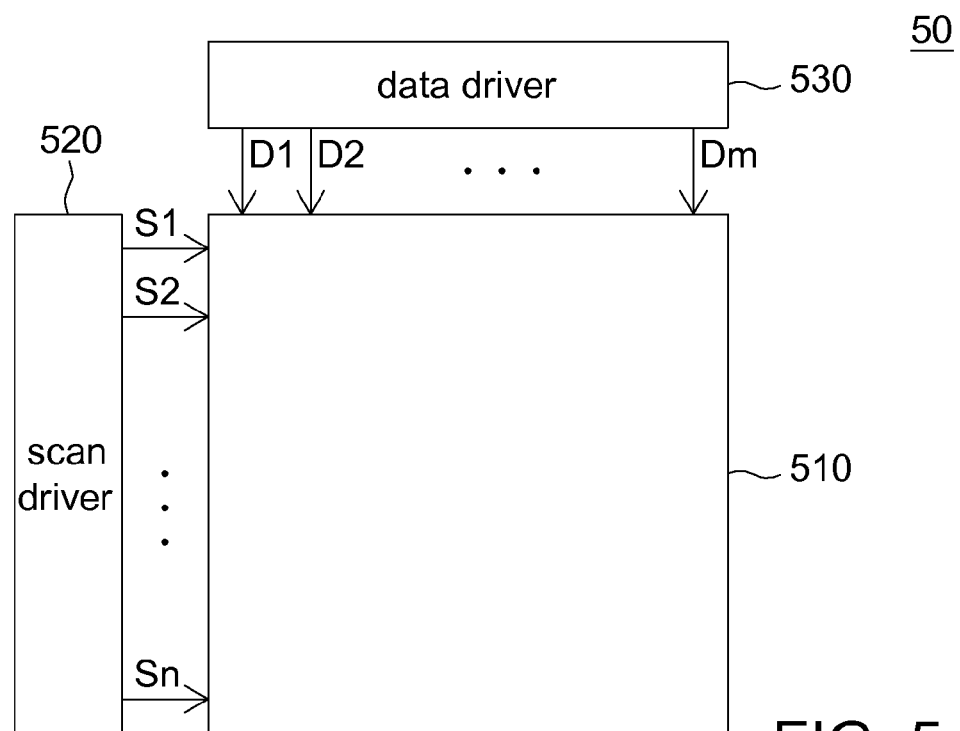
FIG. 5 shows a display.
Figure 6:
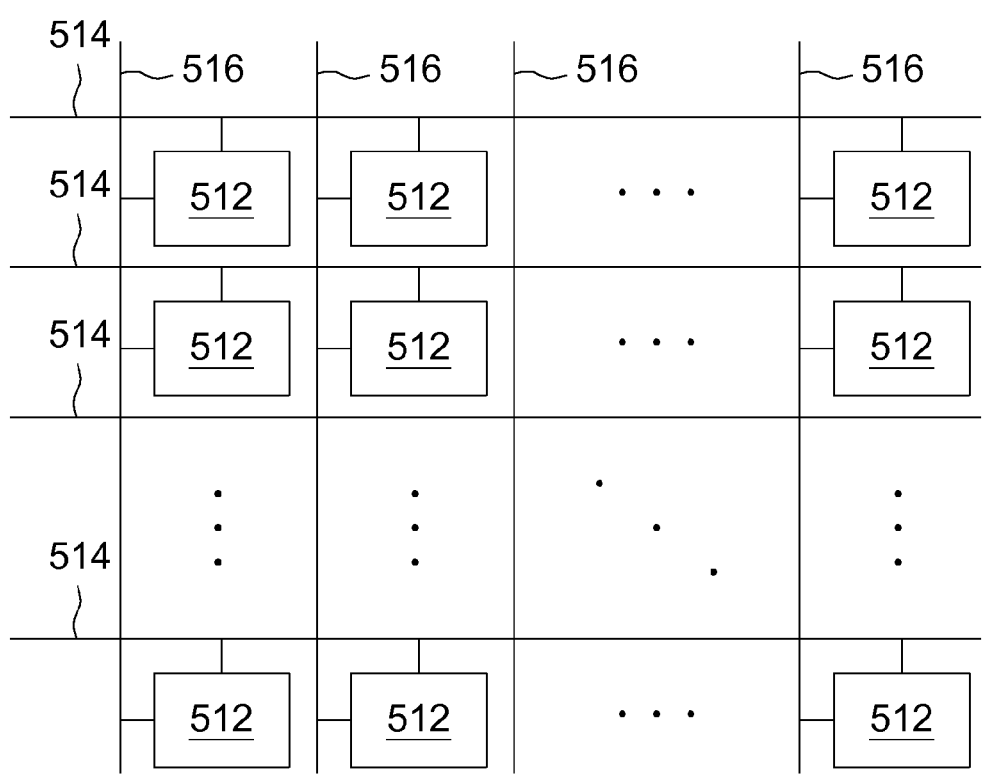
FIG. 6 shows a panel.

Referring to both FIG. 5 and FIG. 6. FIG. 5 shows a display. FIG. 6 shows a panel. The display 50 comprises a panel 510, a scan driver 520 and a data driver 530. The panel 510 comprises pixels 512, scan lines 514 and data lines 516. The data driver 530 provides the data signals D1~Dm, and the scan driver 520 provides the scan signals S1~Sn. The data lines 516 transmit the data signals D1~Dm to the pixels 512, and the scan lines 514 transmit the scan signals S1~Sn to the pixels 512. The scan driver 520 can be realized by such as an amorphous silicon gate (ASG) and can be formed on the panel 510.

The scan driver 520 comprises a shift register circuit which provides output signals respectively corresponding to the scan signals S1~Sn. The shift register circuit adopts a carry shift register to independently output a start signal and adopts a buffer shift register to independently output an output signal. Since the buffer shift register and the carry shift register are divided into two independent loops, the output signal generated by the buffer shift register will not be used as a start signal in the next stage. Thus, when the buffer shift register is interfered with by noises, the noises will not be inputted to the next stage. Thus, the abnormal operation of the shift register circuit due to the amplification of the noises will not occur. The composition of the shift register circuit is elaborated below with a plurality of embodiments.

First Embodiment

Figure 7:
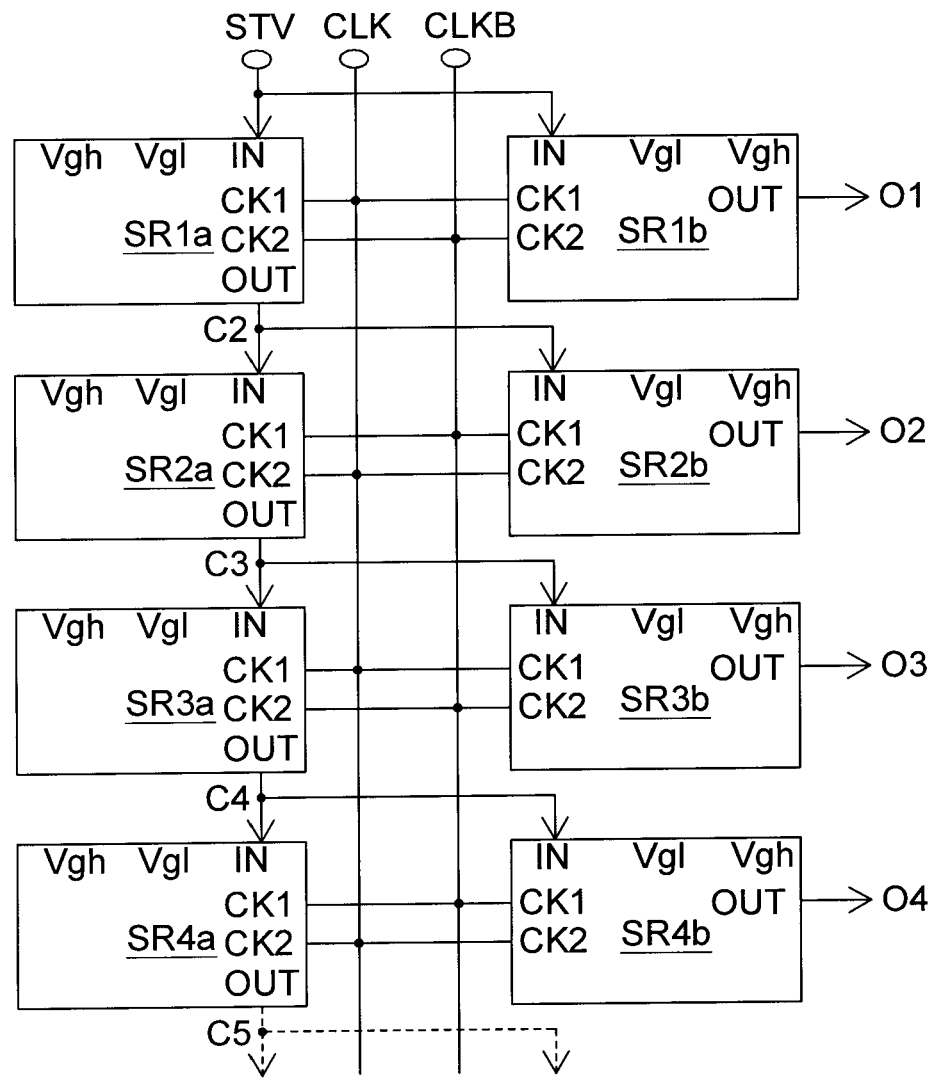
FIG. 7 shows a partial view of a shift register circuit according to a first embodiment of the disclosure.

Referring to FIG. 7, a partial view of a shift register circuit according to a first embodiment of the disclosure is shown. In the first embodiment, one stage of carry shift register goes with one stage of buffer shift register. The scan driver 520 further comprises a shift register circuit 522. The shift register circuit 522 outputs a first stage output signal O1 to a fourth stage output signal O4 respectively corresponding to the scan signals S1~S4. The shift register circuit 522 comprises a first stage carry shift register SR1a to a fourth stage carry shift register SR4a and a first stage buffer shift register SR1b to a fourth stage buffer shift register SR4b. It is noted that in the shift register circuit 522, the number of the carry shift registers is the same with that of the buffer shift registers. The first stage carry shift register SR1a to the fourth stage carry shift register SR4a respectively generate a second stage start signal C2 to a fifth stage start signal C5. The first stage buffer shift register SR1b to the fourth stage buffer shift register SR4b respectively generate the first stage output signal O1 to the fourth stage output signal O4. The first stage output signal O1 to the fourth stage output signal O4 and the first stage start signal C1 to the fourth stage start signal C4 are respectively generated synchronically.

The first stage start signal STV starts the first stage carry shift register SR1a to generate a second stage start signal C2, and further starts the first stage buffer shift register SR1b to output a first stage output signal O1. The second stage start signal C2 starts the second stage carry shift register SR2a to generate a third stage start signal C3, and further starts the second stage buffer shift register SR2b to output a second stage output signal O2. The third stage start signal C3 starts the third stage carry shift register SR3a to generate a fourth stage start signal C4, and further starts the third stage buffer shift register SR3b to output a third stage output signal O3. The fourth stage start signal C4 starts the fourth stage carry shift register SR4a to generate a fifth stage start signal C5, and further starts the fourth stage buffer shift register SR4b to output a fourth stage output signal O4. By the same token, in subsequent stages, the principles of the operations of the carry shift registers and the buffer shift registers are similar to that illustrated in the above disclosure, and the similarities are not repeated here.

In the display region (also referred as active matrix array region) of the display panel, the scan lines and the data lines are interlaced, and when the voltage on the data lines varies, the voltage on the scan lines will varies as well. Thus, the output signal of the conventional shift register circuit will be interfered with by the noises. When the output signal interfered with by the noises is inputted to the next stage shift register, the noises will be amplified and cause abnormal operation to the shift register circuit.

To the contrary, in the first embodiment, since the buffer shift register and carry shift register are divided into two independent loops, the output signal generated by the buffer shift register will not be used as a start signal in the next stage. Thus, when the buffer shift register is interfered with by noises, the noises will not be inputted to the next stage. Thus, the abnormal operation of the shift register circuit due to the amplification of the noises will not occur.

Figure 8:
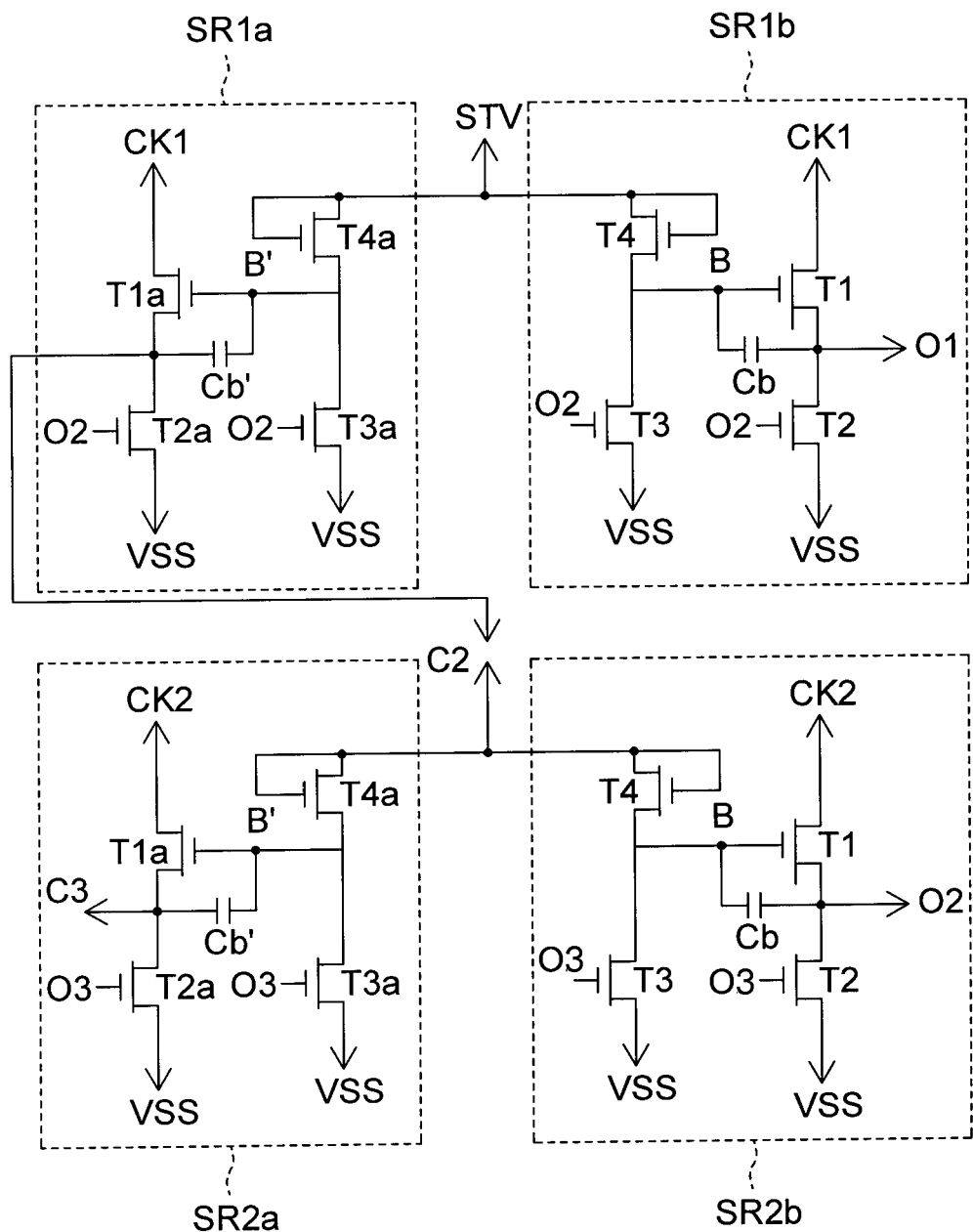
FIG. 8 shows a first circuit diagram of carry shift register and buffer shift register.
Figure 9:
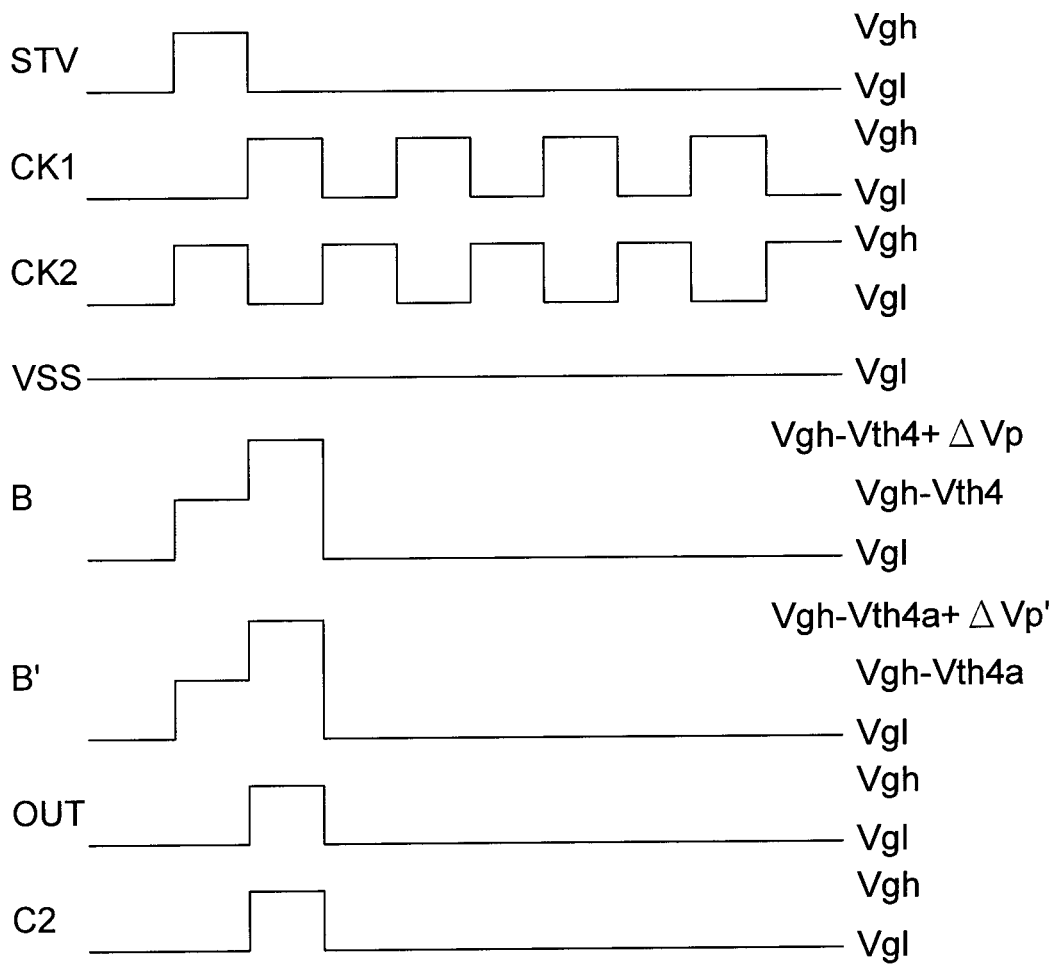
FIG. 9 shows a timing diagram of the signals of FIG. 8.

Referring to both FIG. 8 and FIG. 9. FIG. 8 shows a first circuit diagram of carry shift register and buffer shift register. FIG. 9 shows a timing diagram of the signals of FIG. 8. The first stage carry shift register SR1a comprises transistors T1a~T4a. The buffer shift register SR1b comprises transistors T1~T4. The area ratio of the transistor T1 to that of the transistor T1a is about 5~20. The transistor T1 outputs a first stage output signal O1 according to clock signal CK1. The transistor T2 is coupled to the transistor T1 and controlled by the second stage output signal O2 outputted from the second stage buffer shift register SR2b. The transistor T3 is controlled by the second stage output signal O2 outputted from the second stage buffer shift register SR2b. The transistor T4 is coupled to the transistor T3 for driving the transistor T1 according to the first stage start signal STV. The transistor T2 is coupled to the transistor T1 and transistor T2 via a coupling capacitor Cb. The circuit design of the second stage carry shift register SR2a is identical to that of the first stage carry shift register SR1a, and the similarities are not repeated here.

The circuit design of the first stage buffer shift register SR1b is substantially identical to that of the first stage carry shift register SR1a. The transistor T1a outputs a second stage start signal C2 according to the clock signal CK1. The transistor T2a is coupled to the transistor T1a and controlled by the second stage output signal O2 outputted from the second stage buffer shift register SR2b. The transistor T3a is controlled by the second stage output signal O2 outputted from the second stage buffer shift register SR2. The transistor T4a is coupled to the transistor T3a for driving the transistor T1a according to the first stage start signal STV. The transistor T2a is coupled to the transistor T1a and transistor T2a via a coupling capacitor Cb'. The circuit design of the second stage buffer shift register SR2b is identical to that of the first stage buffer shift register SR1b, and the similarities are not repeated here.

Figure 10:
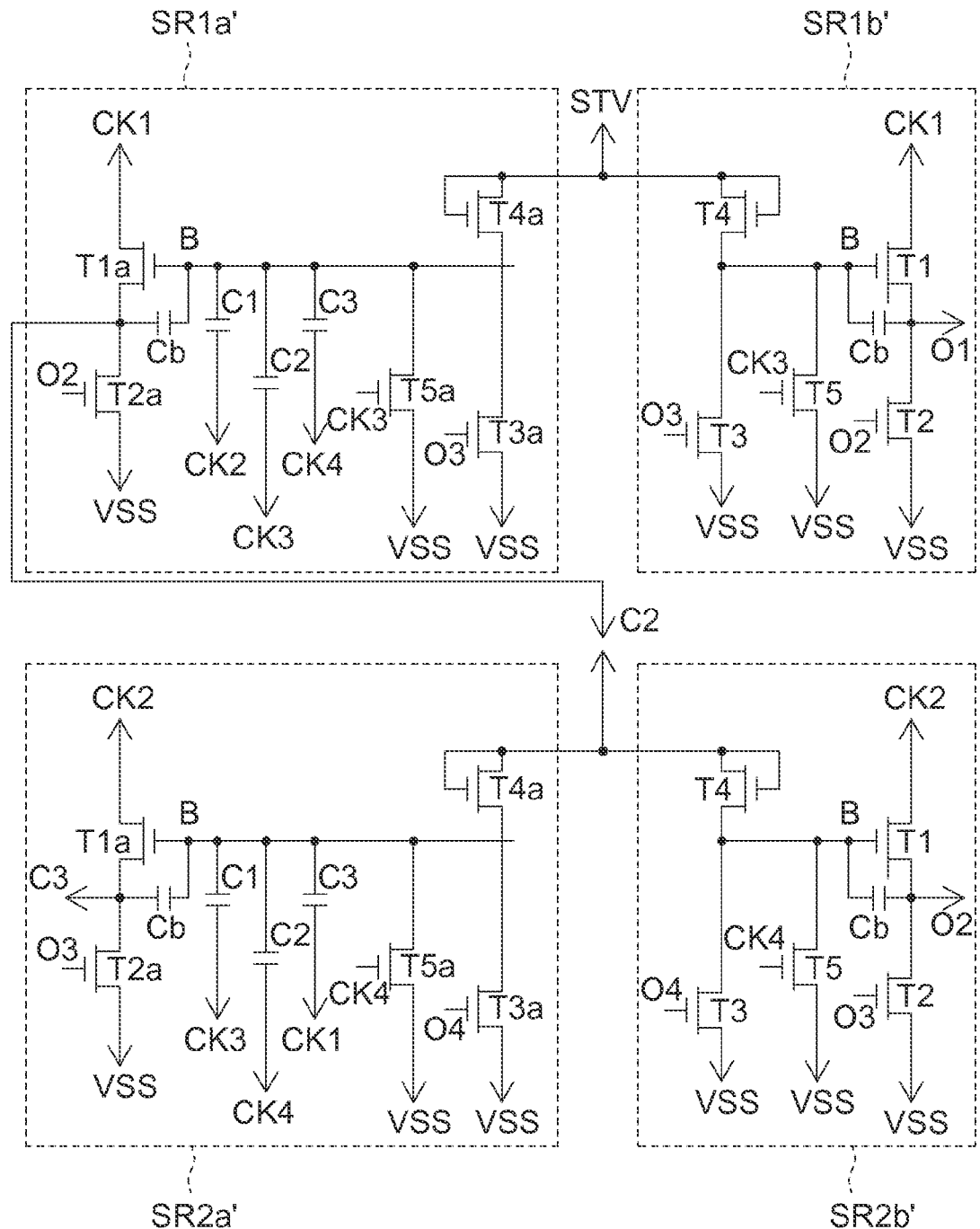
FIG. 10 shows a second circuit diagram of carry shift register and buffer shift register.
Figure 11:
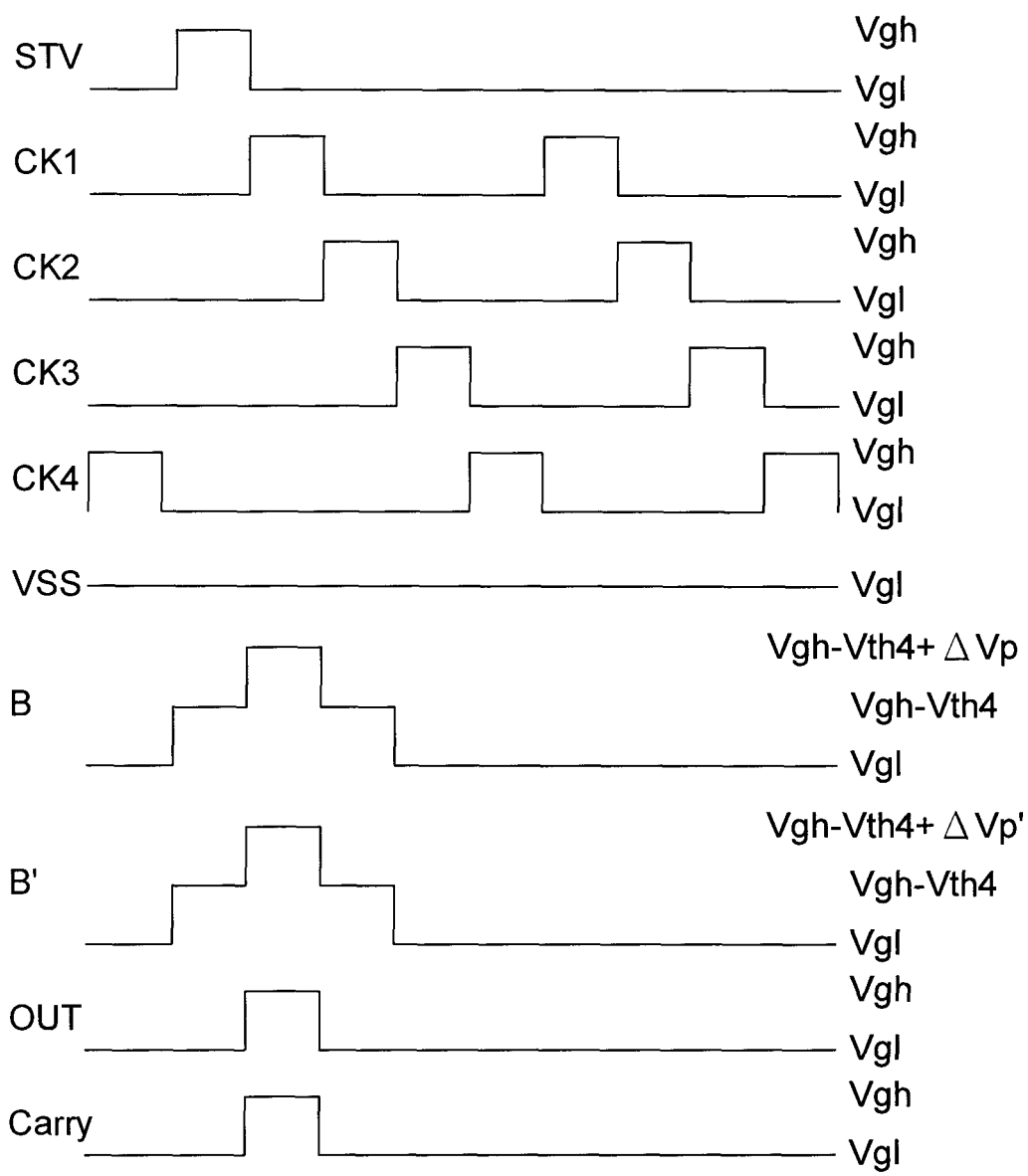
FIG. 11 shows a timing diagram of the signals of FIG. 10.

Referring to FIG. 10 and FIG. 11. FIG. 10 shows a second circuit diagram of carry shift register and buffer shift register. FIG. 11 shows a timing diagram of the signals of FIG. 10. The circuits of carry shift register and the buffer shift register can be realized by that illustrated in FIG. 8 or that illustrated in FIG. 10. The first stage carry shift register SR1a' of FIG. 10 is different from the first stage carry shift register SR1a of FIG. 8 in that: the first stage carry shift register SR1a' further comprises a transistor T5a, a regulation capacitor C1, a regulation capacitor C2 and a regulation capacitor C3, and that the transistor T3a is controlled by the third output signal O3. The transistor T5a is coupled to the transistors T1a, T3a and T4a, and is controlled by clock signal CK3. One terminal of regulation capacitor C1 is coupled to the control terminal of the transistor T1a, and the other terminal of the regulation capacitor C1 receives the clock signal CK2. One terminal of regulation capacitor C2 is coupled to the control terminal of the transistor T1a, and the other terminal of the regulation capacitor C2 receives the clock signal CK3. One terminal of the regulation capacitor C3 is coupled to the control terminal of the transistor T1a, and the other terminal of the regulation capacitor C3 receives the clock signal CK4. The circuit design of the second stage carry shift register SR2a' is identical to that of the first stage carry shift register SR1a' and the similarities are not repeated here.

The first stage buffer shift register SR1b' of FIG. 10 is different from the first stage carry shift register SR1b of FIG. 8 in that: the first stage carry shift register SR1b' further comprises a transistor T5, and the transistor T3 is controlled by the third stage output signal O3. The transistor T5 is coupled to the transistors T1, T3 and T4, and is controlled by the clock signal CK3. The circuit design of the second stage buffer shift register SR2b' is identical to that of the first stage buffer shift register SR1b', and the similarities are not repeated here.

Moreover, the design of the regulation capacitors C1~C3 suppresses the noises generated by the clock signal CK1. When the level of the clock signal CK1 rises, the potential of the node B will be affected due to the parasitic capacitance between the gate and source of the transistor T1a. Thus, the levels of the clock signals CK2~CK4 are stepped down to offset the rise in the level of the clock signal CK1 to assure the normal operation of the shift register circuit.

Second Embodiment

Figure 12:
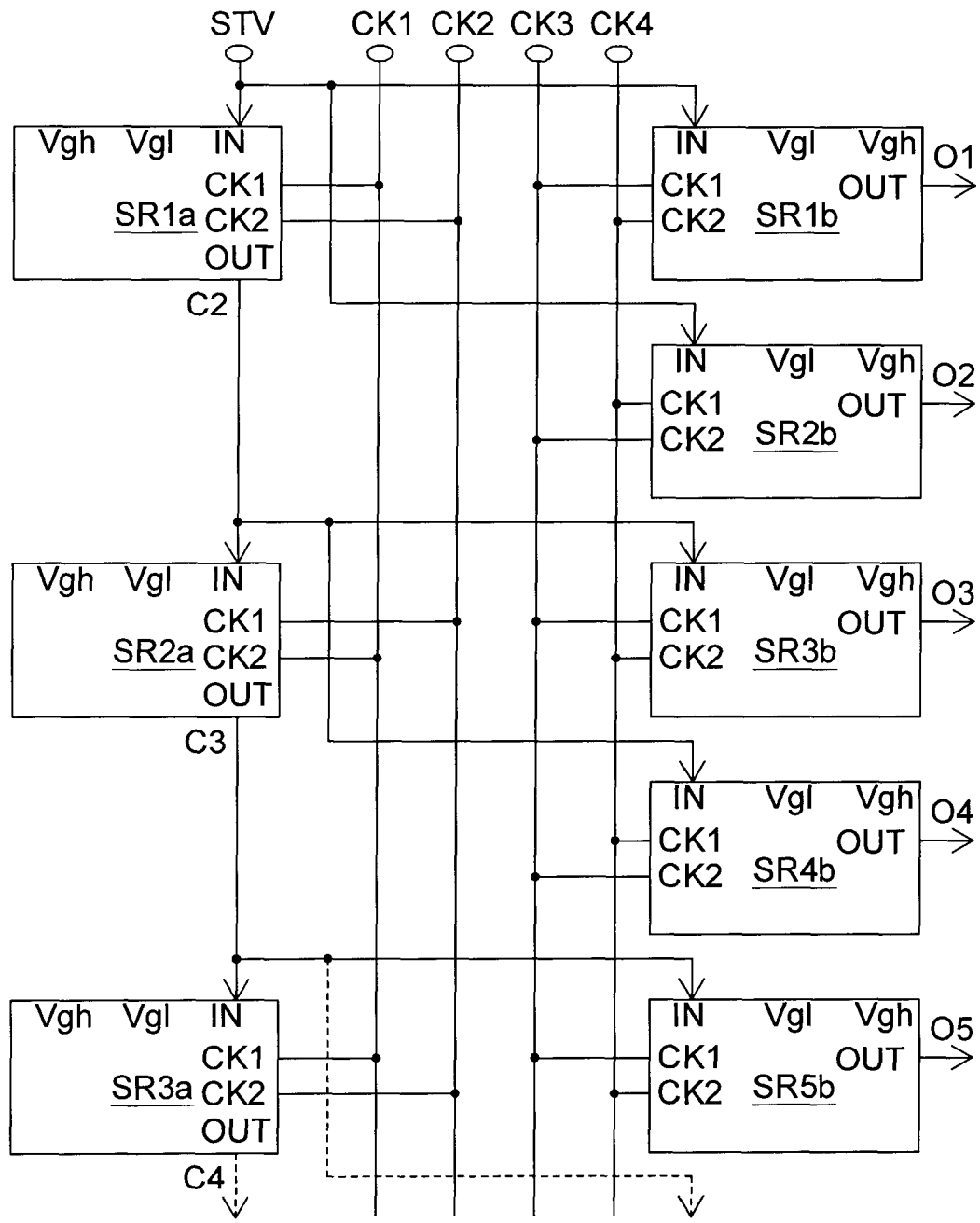
FIG. 12 shows a partial view of a shift register circuit according to a second embodiment of the disclosure.

Referring to FIG. 12, a partial view of a shift register circuit according to a second embodiment of the disclosure is shown. The second embodiment is different from the first embodiment in that: the number of the carry shift registers is different from that of the buffer shift registers. In the second embodiment, one stage of carry shift register goes with a plurality of stages of buffer shift registers. For convenience of elaboration, the second embodiment is exemplified by a shift register circuit in which one stage of carry shift register goes with two stages of buffer shift registers.

The scan driver 520 further comprises a shift register circuit 524. The shift register circuit 524 outputs a first stage output signal O1 to a fifth stage output signal O5 respectively corresponding to the scan signals S1~S5. The shift register circuit 524 comprises a first stage carry shift register SR1a to a third stage carry shift register SR3a and a first stage buffer shift register SR1b to a fifth stage buffer shift register SR5b. It is noted that in the shift register circuit 522, the number of the carry shift registers is smaller than that of the buffer shift registers. The first stage carry shift register SR1a to the third stage carry shift register SR3a respectively generate the second stage start signal C2 to the third stage start signal C4, and the first stage buffer shift register SR1b to the fifth stage buffer shift register SR5b respectively generate the first stage output signal O1 to the fifth stage output signal O5.

The first stage start signal STV starts the first stage carry shift register SR1a to generate a second stage start signal C2. The first stage start signal STV starts the first stage buffer shift register SR1b to output a first stage output signal O1, and further starts the second stage buffer shift register SR2b to output a second stage output signal O2. The second stage start signal C2 starts the second stage carry shift register SR2a to generate a third stage start signal C3. The second stage start signal C2 starts the third stage buffer shift register SR3b to output a third stage output signal O3, and starts the fourth stage buffer shift register SR4b to output a fourth stage output signal O4. By the same token, in subsequent stages, the principles of the operations of the carry shift registers and the buffer shift registers are similar to that illustrated in the above disclosure, and the similarities are not repeated here.

Third Embodiment

Figure 13:
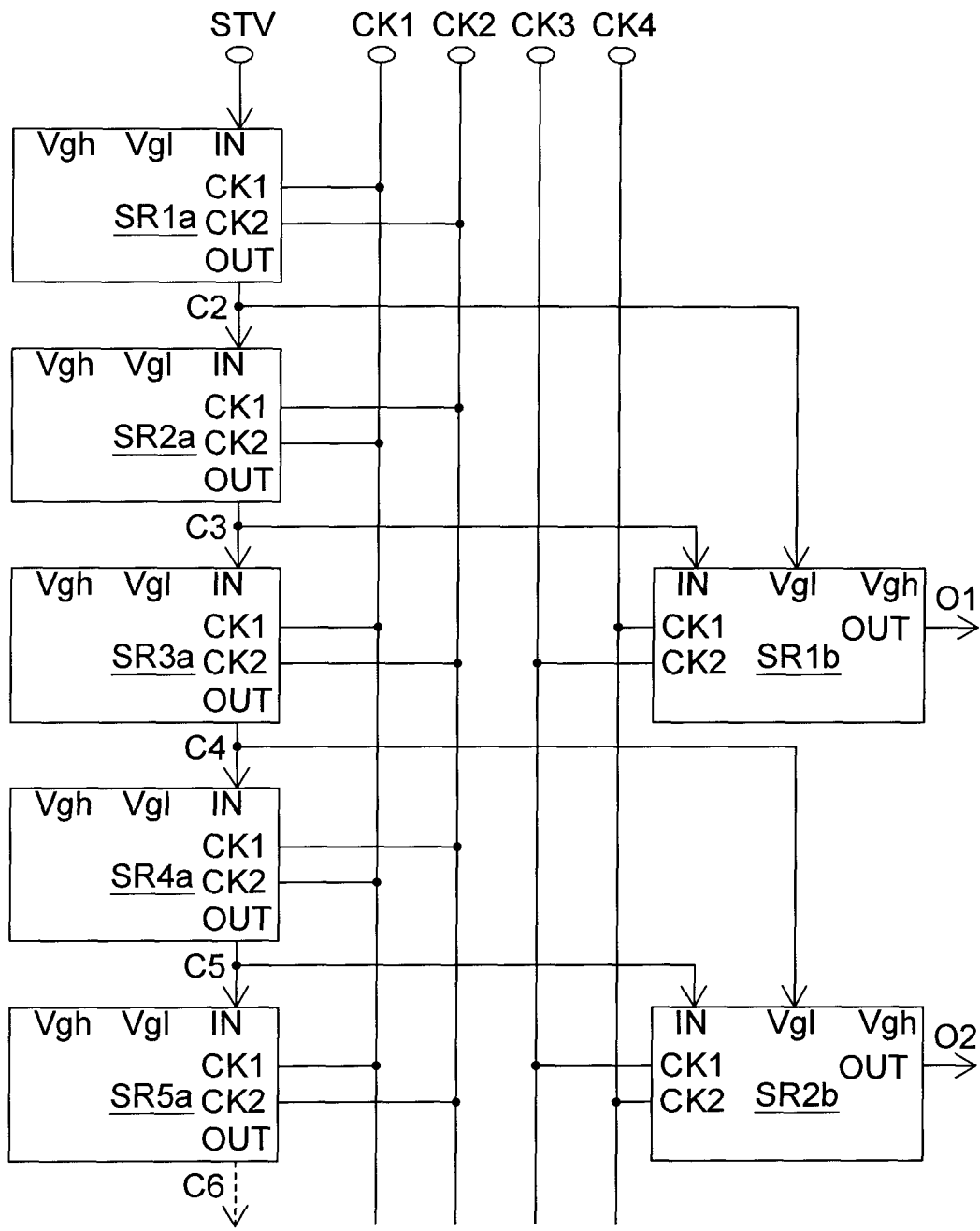
FIG. 13 shows a partial view of a shift register circuit according to a third embodiment of the disclosure.

Referring to FIG. 13, a partial view of a shift register circuit according to a third embodiment of the disclosure is shown. The third embodiment is different from the first embodiment in that: the number of the carry shift registers is different from that of the buffer shift registers. In the third embodiment, one stage of buffer shift register goes with a plurality of stages of carry shift registers. For convenience of elaboration, the third embodiment is exemplified by a shift register circuit in which one stage of buffer shift register goes with two stages of carry shift registers.

The scan driver 520 further comprises a shift register circuit 526. The shift register circuit 526 outputs the first stage output signal O1 and the second stage output signal O2 respectively corresponding to the scan signals S1~S2. The shift register circuit 526 comprises a first stage carry shift register SR1a to a fifth stage carry shift register SR5a and a first stage buffer shift register SR1b and a second stage buffer shift register SR2b. It is noted that in the shift register circuit 526, the number of the carry shift registers is different from that of the buffer shift register. The first stage carry shift register SR1a to the fifth stage carry shift register SR5a respectively generate the second stage start signal C2 to the sixth stage start signal C6. The first stage buffer shift register SR1b and the second stage buffer shift register SR2b respectively generate the first stage output signal O1 and the second stage output signal O2.

The first stage start signal STV starts the first stage carry shift register SR1a to generate a second stage start signal C2, and the second stage start signal C2 starts the second stage carry shift register SR2a to generate a third stage start signal C3. The second stage start signal C2 and the third stage start signal C3 start the first stage buffer shift register SR1b to output a first stage output signal O1.

The third stage start signal C3 starts the third stage carry shift register SR3a to generate a fourth stage start signal C4, which starts the fourth stage carry shift register SR4a to generate a fifth stage start signal C5. The fourth stage start signal C4 and the fifth stage start signal C5 start the second stage buffer shift register SR2b to output a second stage output signal O2. By the same token, in subsequent stages, the principles of the operations of the carry shift registers and the buffer shift registers are similar to that illustrated in the above disclosure, and the similarities are not repeated here.

The shift register circuit and the display disclosed in the above embodiments of the disclosure have many advantages exemplified below:

Firstly, the noises generated due to the clock signals are suppressed to assure the normal operation of the shift register circuit.

Secondly, the noises generated by the display region of the panel are suppressed to assure the normal operation of the shift register circuit.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A display, comprising:
   a panel, comprising:
      a plurality of pixels;
      a plurality of data lines for transmitting a plurality of data signals to these pixels;
      a plurality of scan lines for transmitting a plurality of the scan signals to these pixels;
   a data driver for providing these data signals; and
   a scan driver for providing these scan signals, wherein the scan driver comprises:
      a shift register circuit, comprising:
         a plurality of stages of carry shift registers for generating a plurality of start signals, wherein these start signals comprise an $i^{th}$ start signal and an $i+1^{th}$ start signal, and these stages of carry shift registers comprise:
            an $i^{th}$ stage carry shift register for generating the $i+1^{th}$ start signal to start an $i+1^{th}$ stage carry shift register, so that the $i+1^{th}$ stage carry shift register to generate an $i+2^{th}$ start signal; and
         a plurality of stages of buffer shift registers for generating a plurality of output signals comprising a $j^{th}$ output signal and respectively corresponding to these scan signals, wherein these stages of buffer shift registers comprise:
            a $j^{th}$ stage buffer shift register, wherein the $i+1^{th}$ start signal starts the $j^{th}$ stage buffer shift register to generate the $j^{th}$ output signal, wherein the $j^{th}$ output signal and the $i+2^{th}$ start signal are generated from the i+1 start signal, wherein j is equal to i+1.

2. The display according to claim 1, wherein the $i^{th}$ start signal starts the $i^{th}$ stage carry shift register to generate the $i+1^{th}$ start signal.

3. The display according to claim 1, wherein the number of the stages of carry shift registers is different from that of the stages of buffer shift registers.

4. The display according to claim 1, wherein these stages of buffer shift register further comprise:
   a $j+1^{th}$ stage buffer shift register, wherein the $i+2^{th}$ start signal further starts the $j+1^{th}$ stage buffer shift register to output a $j+1^{th}$ output signal.

5. The display according to claim 1, wherein the $j^{th}$ stage buffer shift register comprises:
   a first transistor for outputting the $j^{th}$ output signal according to a first clock signal;
   a second transistor coupled to the first transistor and controlled by a $j+1^{th}$ output signal;
   a third transistor controlled by the $j+1^{th}$ output signal; and
   a fourth transistor coupled to the third transistor for driving the first transistor according to the $i+1^{th}$ start signal; and
   a first coupling capacitor via which the third transistor and the fourth transistor are coupled to the second transistor.

6. The display according to claim 5, wherein the $i+1^{th}$ stage carry shift register comprises:
   a fifth transistor for outputting the $i+2^{th}$ start signal according to the first clock signal;
   a sixth transistor coupled to the fifth transistor and controlled by the $j+1^{th}$ output signal;
   a seventh transistor controlled by the $j+1^{th}$ output signal; and
   an eighth transistor coupled to the seventh transistor for driving the fifth transistor according to the $i+1^{th}$ start signal; and
   a second coupling capacitor via which the seventh transistor and the eighth transistor is coupled to the sixth transistor.

7. The display according to claim 6, wherein the area ratio of the first transistor to the fifth transistor is about 5~20.

8. The display according to claim 1, wherein the $j^{th}$ stage buffer shift register comprises:
   a first transistor for outputting the $j^{th}$ output signal according to a first clock signal;
   a second transistor coupled to the first transistor and controlled by a $j+1^{th}$ output signal;
   a third transistor controlled by a $j+2^{th}$ output signal; and
   a fourth transistor coupled to the third transistor for driving the first transistor according to the $i+1^{th}$ start signal;
   a fifth transistor controlled by a third clock signal and coupled to the first transistor, the third transistor and the fourth transistor; and
   a first coupling capacitor via which the third transistor and the fourth transistor are coupled to the second transistor.

9. The display according to claim 8, wherein the $i+1^{th}$ stage carry shift register comprises:
   a sixth transistor for outputting the $i+2^{th}$ start signal according to the first clock signal;
   a seventh transistor coupled to the sixth transistor and controlled by the $j+1^{th}$ output signal;
   an eighth transistor controlled by the $j+2^{th}$ output signal; and
   a ninth transistor coupled to the eighth transistor for driving the sixth transistor according to the $i+1^{th}$ start signal;
   a tenth transistor controlled by the third clock signal and coupled to the sixth transistor, the eighth transistor and the ninth transistor;
   a second coupling capacitor via which the eighth transistor and the ninth transistor are coupled to the seventh transistor;
   a first regulation capacitor, wherein one terminal of the first regulation capacitor is coupled to the control terminal of the sixth transistor, and the other terminal of the first regulation capacitor receives a second clock signal;
   a second regulation capacitor, wherein one terminal of the second regulation capacitor is coupled to the control terminal of the sixth transistor, and the other terminal of the second regulation capacitor receives the third clock signal; and
   a third regulation capacitor, wherein one terminal of the third regulation capacitor is coupled to the control terminal of the sixth transistor, and the other terminal of the third regulation capacitor receives a fourth clock signal.

10. The display according to claim 9, wherein the area ratio of the first transistor to the sixth transistor is about 5~20.

* * * * *